(12) United States Patent
Regev et al.

(10) Patent No.: US 7,016,210 B2
(45) Date of Patent: Mar. 21, 2006

(54) LONGEST MATCH DETECTION IN A CAM

(75) Inventors: Alon Regev, Woodland Hills, CA (US); Zvi Regev, West Hills, CA (US)

(73) Assignee: Micron Technology, Inc., Boise, ID (US)

( * ) Notice: Subject to any disclaimer, the term of this patent is extended or adjusted under 35 U.S.C. 154(b) by 138 days.

(21) Appl. No.: 10/330,209

(22) Filed: Dec. 30, 2002

(65) Prior Publication Data

US 2004/0125631 A1    Jul. 1, 2004

(51) Int. Cl.
*G11C 15/00*    (2006.01)
(52) U.S. Cl. .................... 365/49; 711/108; 365/230.06
(58) Field of Classification Search ................ 365/49, 365/230.06; 711/108; 326/105, 106, 107, 326/108
See application file for complete search history.

(56) References Cited

U.S. PATENT DOCUMENTS

| | | | |
|---|---|---|---|
| 5,051,948 A * | 9/1991 | Watabe et al. ......... | 365/185.07 |
| 5,920,886 A * | 7/1999 | Feldmeier ................ | 711/108 |
| 6,415,354 B1 * | 7/2002 | Joffe et al. ............... | 711/108 |
| 6,577,520 B1 * | 6/2003 | Mick .......................... | 365/49 |
| 6,665,202 B1 * | 12/2003 | Lindahl et al. .......... | 711/108 |
| 6,697,912 B1 * | 2/2004 | Akkary .................... | 711/108 |
| 6,757,779 B1 * | 6/2004 | Nataraj et al. ........... | 711/108 |

* cited by examiner

*Primary Examiner*—Richard Elms
*Assistant Examiner*—J. H. Hur
(74) *Attorney, Agent, or Firm*—Dickstein Shapiro Morin & Oshinsky

(57) ABSTRACT

An apparatus and method for a CAM priority match detection circuit that identifies one or more CAM words from a group of CAM words having a "longest match" that matches the bits in a corresponding comparand register. A decoder uses n input lines and m complement lines to generate $2^n$ outputs, wherein only one of the outputs will be active. A priority setting circuit resolves an initial matching operation to supply priority values to CAM words, and a priority resolving circuit processes the priority values to determine an overall priority for a group of CAM words.

44 Claims, 9 Drawing Sheets

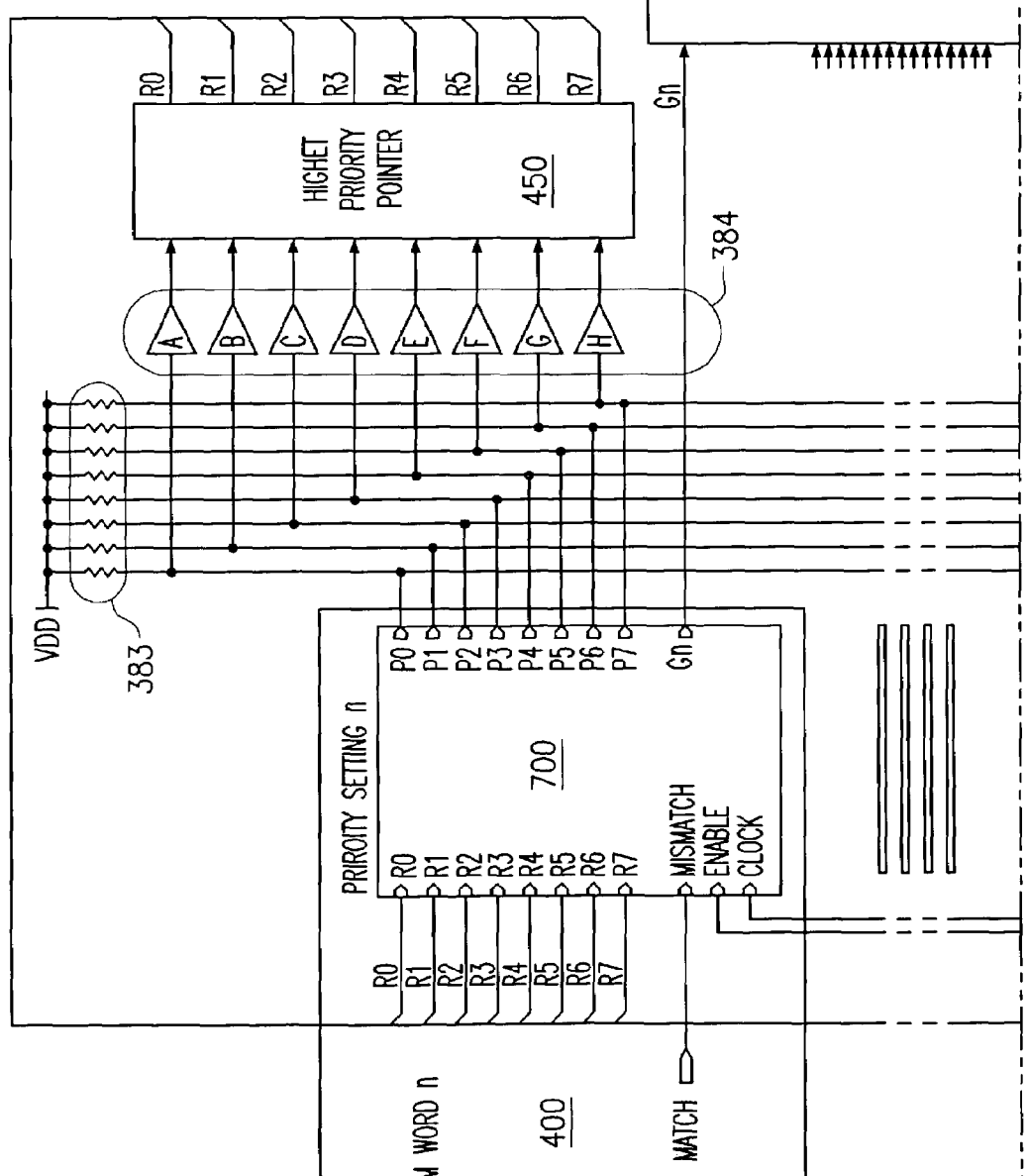

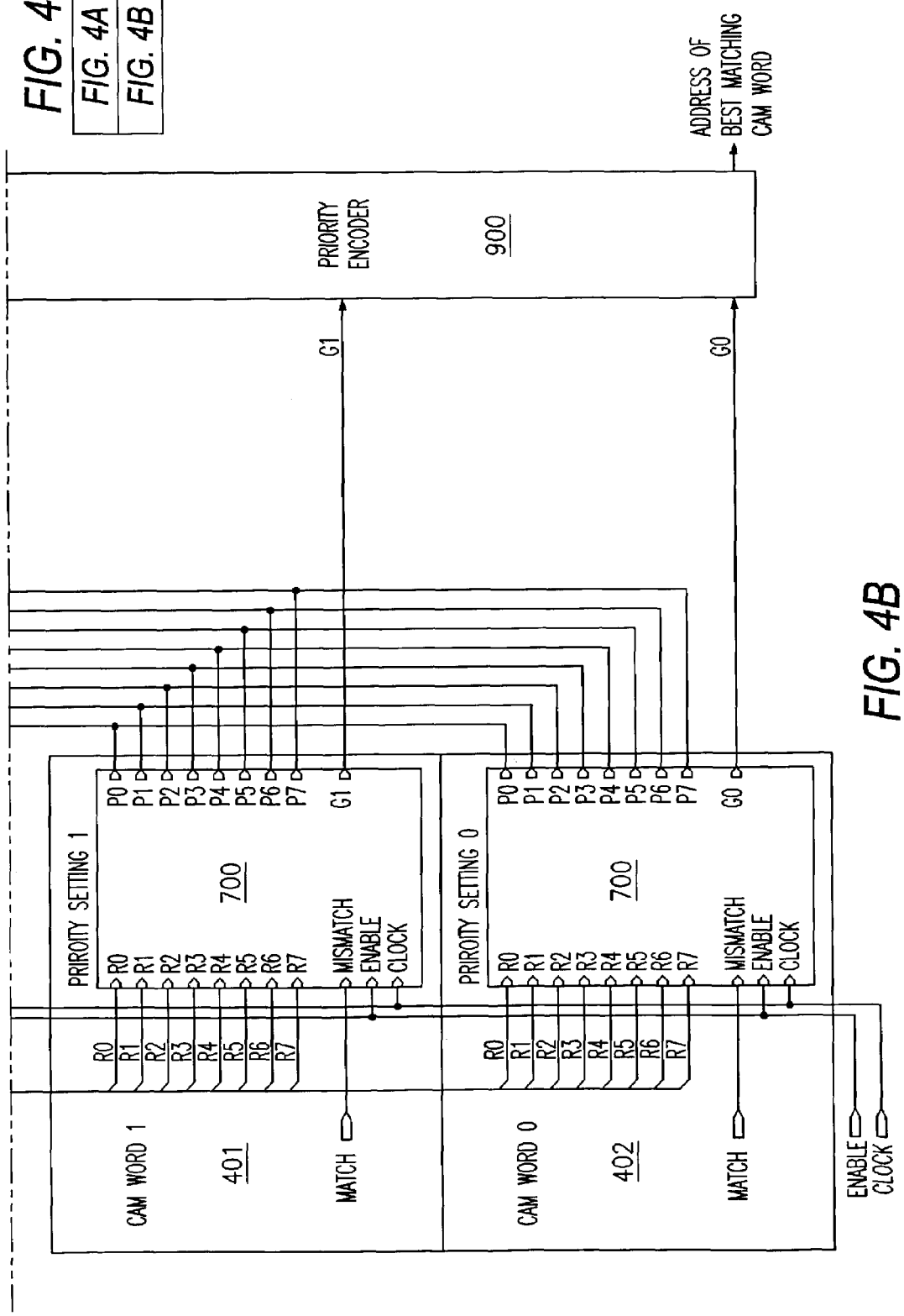

LONGEST MATCH DETECTION IN A CAM

FIELD OF THE INVENTION

The present invention relates generally to semiconductor memory devices and, more particularly to priority resolvers, match detection and finding the longest match in a group of content addressable memory (CAM) device.

BACKGROUND OF THE INVENTION

An essential semiconductor device is semiconductor memory, such as a random access memory (RAM) device. A RAM allows a memory circuit to execute both read and write operations on its memory cells. Typical examples of RAM devices include dynamic random access memory (DRAM) and static random access memory (SRAM).

Another form of memory is the content addressable memory (CAM) device. A conventional CAM is viewed as a static storage device constructed of modified RAM cells. A CAM is a memory device that accelerates any application requiring fast searches of a database, list, or pattern, such as in database machines, image or voice recognition, or computer and communication networks. CAMs provide benefits over other memory search algorithms by simultaneously comparing the desired information (i.e., data in the comparand register) against the entire list of pre-stored entries. As a result of their unique searching algorithm, CAM devices are frequently employed in network equipment, particularly routers, gateways and switches, computer systems and other devices that require rapid content searching, such as routing tables for data networks or matching URLs. Some of these tables are "learned" from the data passing through the network. Other tables, however, are fixed tables that are loaded into the CAM by a system controller. These fixed tables reside in the CAM for a relatively long period of time. A word in a CAM is typically very large and can be 96 bits or more.

In order to perform a memory search in the above-identified manner, CAMs are organized differently than other memory devices (e.g., DRAM and SRAM). For example, data is stored in a RAM in a particular location, called an address. During a memory access, the user supplies an address and reads into or gets back the data at the specified address.

In a CAM, however, data is stored in locations in a somewhat random fashion. The locations can be selected by an address bus, or the data can be written into the first empty memory location. Every location has one or a pair of status bits that keep track of whether the location is storing valid information in it or is empty and available for writing.

Once information is stored in a memory location, it is found by comparing every bit in memory with data in the comparand register. When the contents stored in the CAM memory location does not match the data in the comparand register, the local match detection circuit returns a no match indication. When the contents stored in the CAM memory location matches the data in the comparand register, the local match detection circuit returns a match indication. If one or more local match detect circuits return a match indication, the CAM device returns a "match" indication. Otherwise, the CAM device returns a "no-match" indication. In addition, the CAM may return the identification of the address location in which the desired data is stored or one of such addresses, if more than one address contained matching data. Thus, with a CAM, the user supplies the data and gets back the address if there is a match found in memory.

Conventional CAMs use priority encoders to translate the physical location of a searched pattern that is located to a number/address identifying that pattern. Typically, priority encoders are designed as a major block common to the whole device. Such a design requires conductors from virtually every word in the CAM to be connected to the priority encoder. Typically, a priority encoder consists of two logical blocks—a highest priority indicator and an address encoder.

A priority encoder is a device with a plurality of inputs, wherein each of the inputs has an assigned priority. When an input is received on a high priority line in a highest priority indicator, all of the inputs of a lesser priority are disabled, forcing their associated outputs to remain inactive. If any numbers of inputs are simultaneously active, the highest priority indicator will activate only the output associated with the highest priority active input, leaving all other outputs inactive. Even if several inputs are simultaneously active, the priority encoder will indicate only the activity of the input with the highest priority. The priority address encoder is used in the CAM as the means to translate the position (within the CAM) of a matching word into a numerical address representing that location. The priority address encoder is also used to translate the location of only one word and ignore all other simultaneously matching words. However, often times, there is a need to resolve the priority among multiple inputs, each having a different assigned priority.

Furthermore, there is a need to effectively resolve "imperfect" matches, that is, stored CAM words that may match only a certain number of bits of the data in the comparand, but does not match every bit. Such CAM words are referred to as having a "longest match" condition. In prior art CAMs, search results typically require an exact match (i.e., 100% of the bits) before a system can process those results. Under one method, if an exact match is not found between the stored word and the full comparand, then selected bits in the comparand are masked and the search operation is repeated in an attempt to find a shorter match. If one bit of the comparand is masked at a time, then finding the longest match will require many repeated and undesirable operations/searches. Furthermore, as more bits become masked, multiple matches are indicated for any search result. Without a way to resolve multiple matches, users are typically left to examine the matches manually to find specific properties making one match more desirable than another.

In an alternative method, data in the CAM is stored in an ordered fashion, wherein data of a certain kind or location is assigned a higher priority, while data of another kind or location is given a lower priority. The priority can be established through assigned priority codes provided by a user. Like the first method described above, the alternative method also requires an exact match. Without an exact match, multiple search attempts are required, wherein, on each attempt, selected bits are masked so that they will not be involved in the matching process. As a result, several matches may be indicated for any search.

The alternative method is most often found in network communications, where routing tables are used to determine how a message is routed. Messages communicated through the network typically carry data pointing to the desired final destination, as well as topological data that informs the network of how the message is to be routed. Most network systems are configured in a way that only the last router, in a chain of routers in a network, will have the complete routing information and paths. All of the other routers in the path have information on only neighboring routers in a path.

Accordingly, when a search is conducted on any router (other than the last router), the routing tables will not have the complete routing information, and will form matches between the searched routing information and the masked data available in the routing table.

Similar to the first method, a disadvantage of the alternative method is that multiple matching attempts have to be made before a usable match can be found. Secondly, the process of masking bits typically produces multiple matches, where users are left to re-examine each of the matches manually to prioritize the search results. Finally, CAM searches in network communication do not always require an exact match in order for the search to be useful. Often times, an imperfect match result contains sufficient network and "nearest router" data to be used to route the message. However, conventional network systems have not been able to process this data effectively to make use of a "longest match" condition. Accordingly, a system and method is thus needed to determine a "longest match" in a group of CAM words and assign a priority value to each of the longest matches in a single operation.

BRIEF SUMMARY OF THE INVENTION

The present invention provides a CAM match detection circuit and method that detects and resolves multiple CAM words having "longest match" conditions. An embodiment of the invention identifies at least one CAM word that has the largest number of bits matching a search parameter. A priority resolver is disclosed that establishes "longest match" detection on a group of CAM words. A decoder circuit is further disclosed, which assists the system in the present invention to resolve CAM priorities.

In the present invention data in the CAM does not have to be stored in a specific order in the CAM in order to enable the search for a longest match. Instead a lateral priority code is attached to every entry in the CAM, identifying the level of completeness of the data in that word. CAM words with complete data are assigned the highest lateral priority, and the level of the assigned lateral priority descends as the data in a word has fewer matching bits.

In a search for a word in the CAM with the most complete data, also known as the search for the longest match, certain bits in the comparand register are masked such that those bits are not involved in the matching process. In the ensuing search, several words in the CAM can match the unmasked data in the comparand register. In the word selection process, the lateral priority of only the matching words (i.e., where each unmasked bit of the comparand matches each corresponding bit of the CAM word) are resolved. Matching CAM words with the highest lateral priority are selected to the second stage of the process wherein a single word is selected, and its address provided at the output of the CAM.

BRIEF DESCRIPTION OF THE DRAWINGS

The above and other features and advantages of the invention will be more readily understood from the following detailed description of the invention which is provided in connection with the accompanying drawings.

FIG. 4 illustrates a priority selection circuit used in the priority match detection circuit of FIG. 1;

DETAILED DESCRIPTION OF THE INVENTION

In the following detailed description, reference is made to the accompanying drawings which form a part hereof, and in which is shown by way of illustration specific embodiments in which the invention may be practiced. These embodiments are described in sufficient detail to enable those of ordinary skill in the art to make and use the invention, and it is to be understood that structural, logical or procedural changes may be made to the specific embodiments disclosed without departing from the spirit and scope of the present invention.

Figure 1:
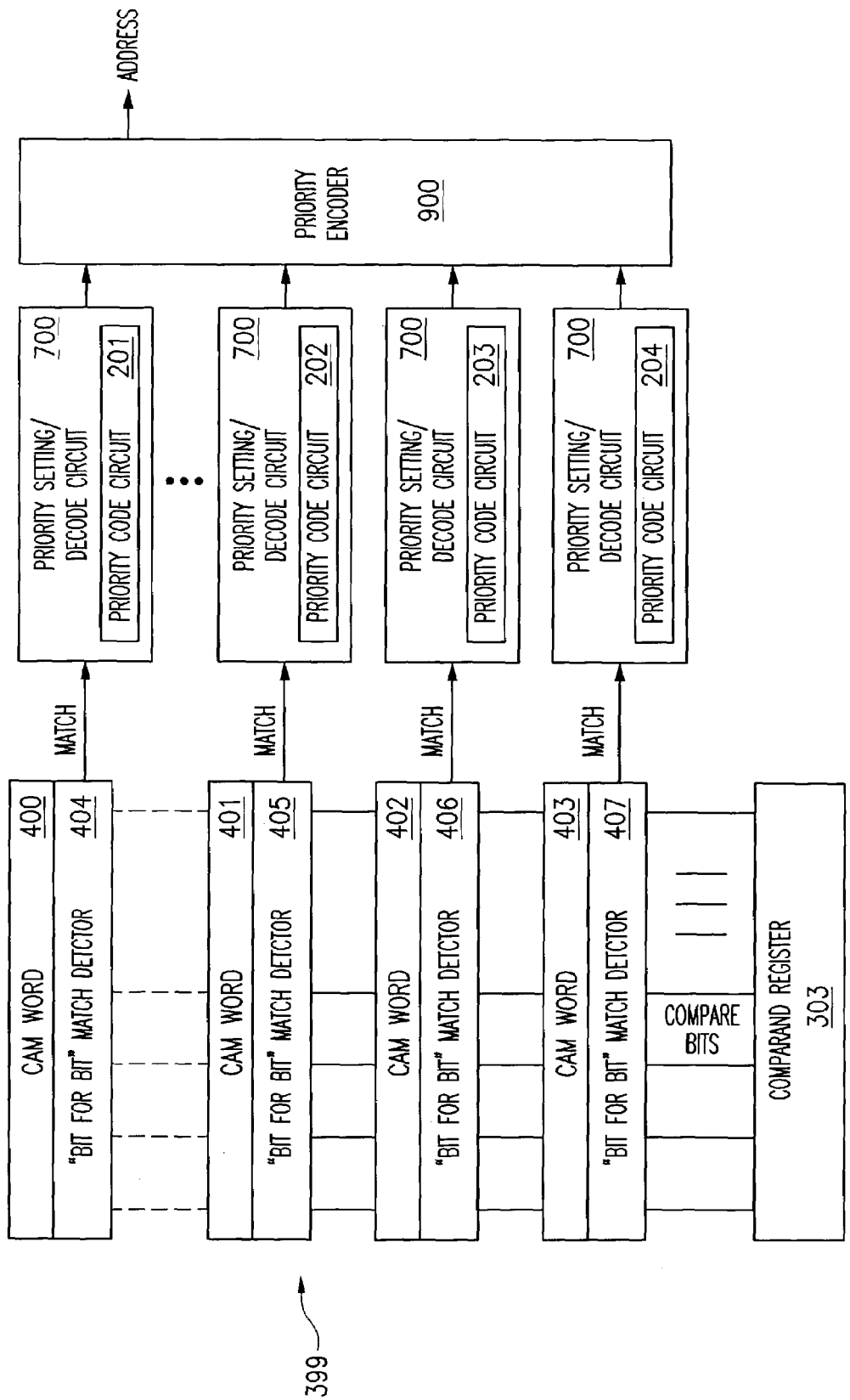
FIG. 1 illustrates a priority match detection circuit according to an embodiment of the invention.

FIG. 1 illustrates an embodiment showing a priority match detection circuit, which detects "longest match" conditions on every pattern stored in the space of a CAM, and further assigns a priority to each of the "longest match" CAM words having the largest amount of matching bits. Generally, CAM words having the largest amount of matching bits are assigned the highest priority and vice versa. The comparand register 303 shown in FIG. 1 is loaded with search data. The bits in the comparand register 303 are transmitted in parallel to the "bit for bit" match detectors 404–407 that accompany each CAM word 400–403. The results of the match detection are forwarded to a respective priority setting circuit 700, which also includes a respective priority code circuit (201–204). The results of the priority setting circuit 700 are then forwarded to priority encoder 900 for ultimately selecting one CAM word with the highest lateral priority.

Figure 2:
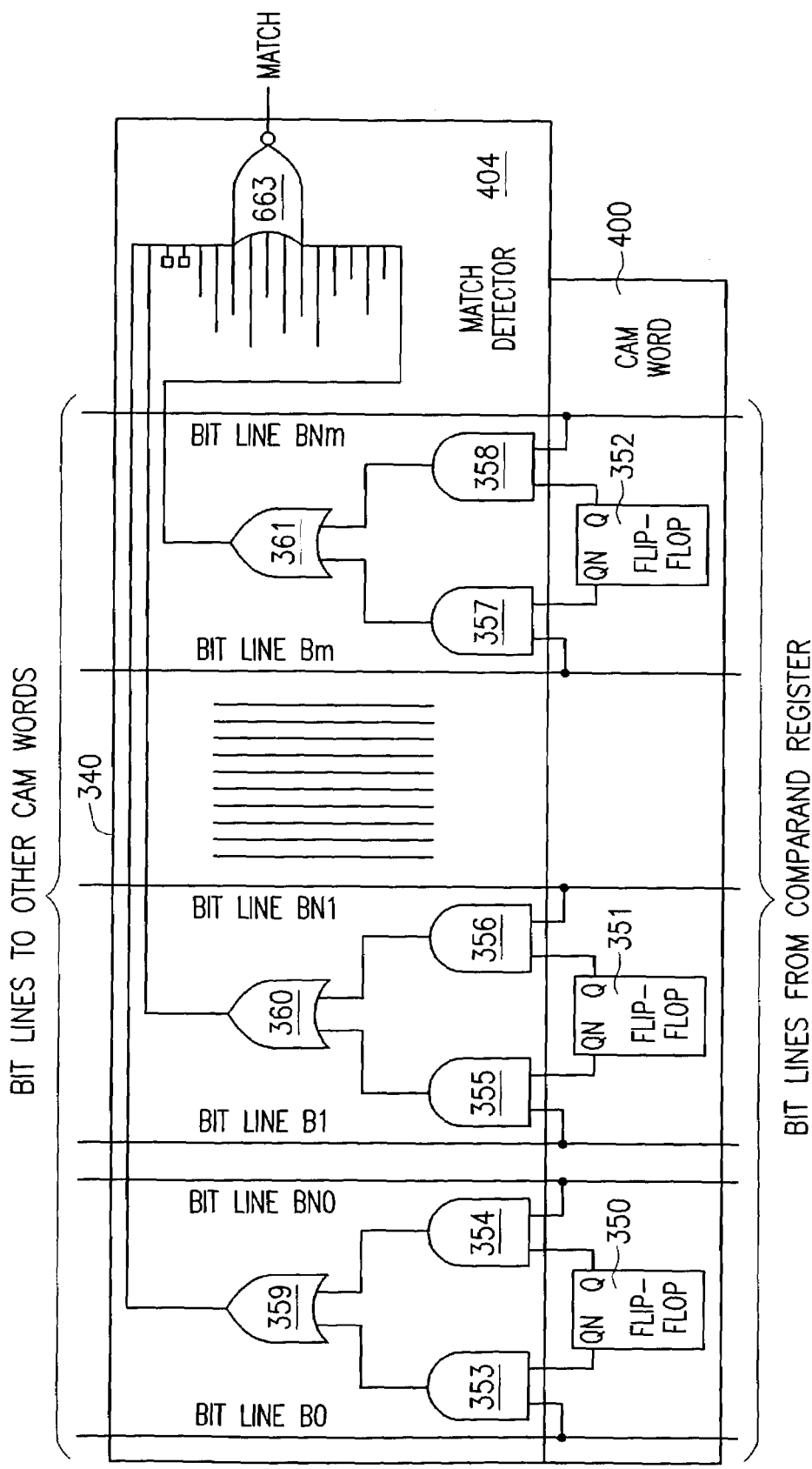
FIG. 2 illustrates a bit-for-bit match detection circuit for a CAM word.

FIG. 2 discloses in further detail the "bit for bit" match detector (e.g., 404) for each CAM word (e.g., 400). Bit lines from the comparand register (BIT LINE B0–BIT LINE Bm) connect through each CAM word in parallel and are outputted 340 at the same bit line location at each CAM word. The bit lines are also connected to one input of an AND gate 353–358 in the match detector 404. Flip flops 350–352 are used as a memory device for each bit in the CAM word 312, wherein each output (Q) and complement (QN) is connected to a respective second input of the AND gates (353–358) as shown in FIG. 2. Each two AND gates associated with one bit (353–354, 355–356 & 357–358) are then connected to the inputs of a respective OR gate (359–361). The output of each OR gate 359–361 is then connected to an input terminal of an NOR gate 663. This gate combination is used to compare the data stored in the CAM word 312 with the corresponding data stored in the comparand register 303. As will be described below, each time a match is detected between a bit in the CAM word 400 and a corresponding bit in the comparand 303 (e.g., each time any of the outputs on OR gates 359–361 are logic "0") then NOR gate 663 outputs a MATCH signal to a priority setting circuit 700 (of FIG. 3), described below.

The logic function generated by each group of gates 353–361 is an exclusive OR (EXOR) function $[(B_m*QN_m)+(BN_m*Q_m)]$. Whenever there is a mismatch, the Q output of a CAM word flip-flop will be the same as the respectively compared bit $BN_m$ from the comparand register 303, providing a logic "1" output on the respective OR gate (359–361). Conversely, if there is a match, then the output on the respective OR gate (359–361) will be a logic "0." If the outputs from all the OR gates 359–361 are "0," then there is a match between all of the unmasked bits in the comparand register 303 and the corresponding bits in the CAM word (e.g., 400). In any case, as the bits in the CAM word 400 are compared one by one with the bits in the comparand 303, for every match detected, a MATCH signal is sent by NOR gate 663 to the priority setting circuit 700 of FIG. 3.

Figure 3:
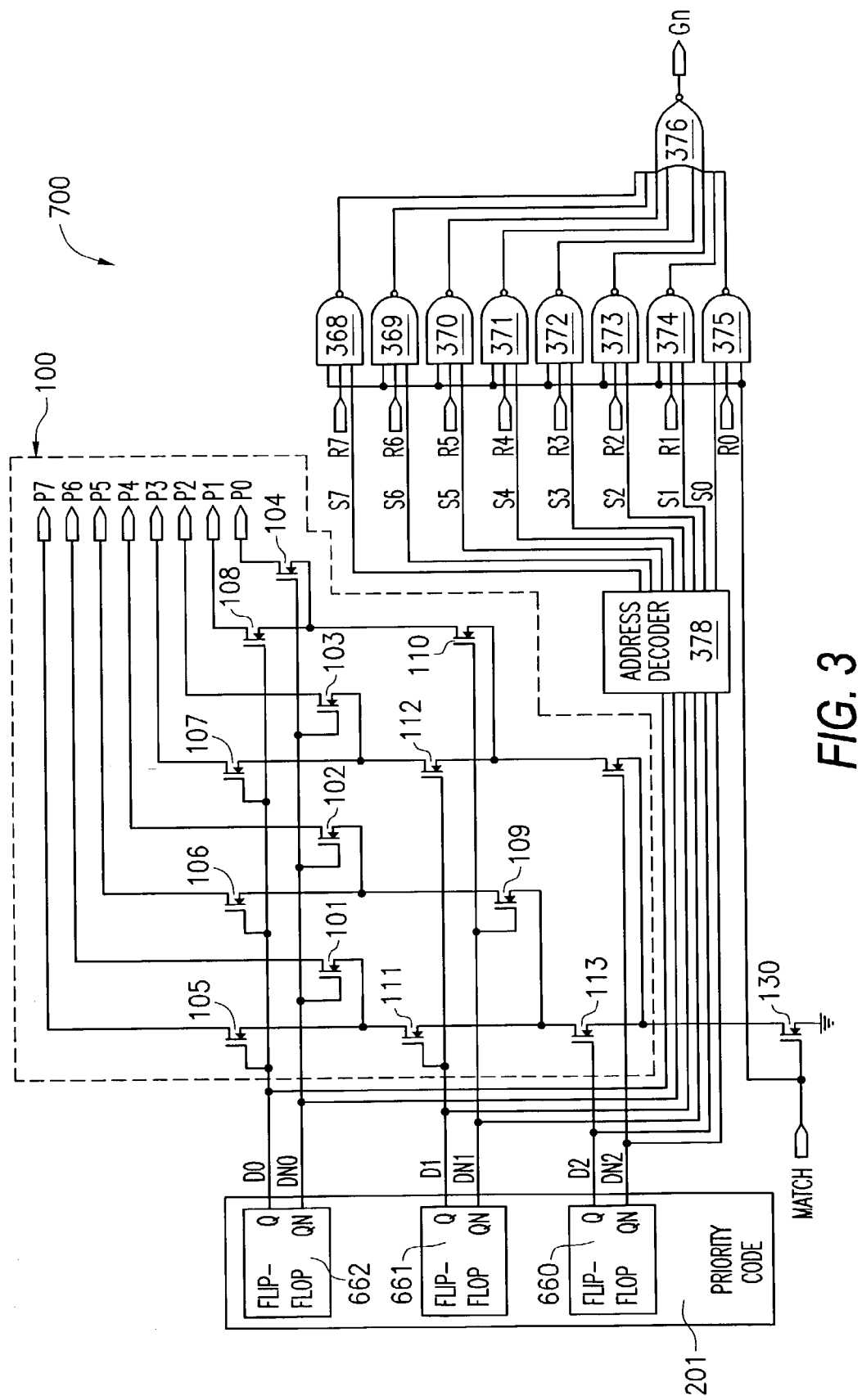
FIG. 3 illustrates a priority setting circuit used in the priority match detection circuit of FIG. 1.

FIG. 3 illustrates a priority setting circuit 700 used in the priority match detection circuit 399 of FIG. 1. A separate priority setting circuit 700 is associated with each CAM word (400–403), wherein a priority code 201 associated with a CAM word, is connected to current decoder 100 and address decoder 378. Priority code 201 is comprised of a set of flip-flops 660–662, each of which are programmed with a bit of the priority code assigned to each respective CAM word. The priority code may be preset by the user for each CAM word (e.g., depending upon the type of data being stored by the CAM word). Whenever a logic "high" MATCH signal is received from an associated CAM word, it is inputted to and activates transistor 130. This, in turn, activates decoder circuit 100. The logic "high" MATCH signal is also forwarded to a first terminal of each of AND gates 368–375.

The exemplary decoder 100 depicted in FIG. 3 is a 3×8 current-based decoder, where a priority input code comprising 3 bits (D0–D2) and their respective complements (DN0–DN2) is entered into the decoder 100, generating an 8-bit priority code output (P0–P7). When activated, each priority code output line (P0–P7) may pass a current to ground via transistor 130. As will be described more fully below, the presence of such a current dictates which priority code output (P0–P7) is activated. It is understood that, while a 3×8 decoder is used in this exemplary embodiment, that any size decoder may be used having n inputs, with associated m complement inputs, and $2^n$ outputs.

The input line D0 (i.e., the LSB for the priority code for the CAM word) of decoder 100 is connected to the gate terminal of n-type transistors 105–108. The drain terminals of transistors 105–108 are connected to the output lines P7, P5, P3 and P1 respectively. Similarly, complement input line DN0 is connected to a respective gate terminal of n-type transistors 101–104. The drain terminal of transistors 101–104 are connected to output lines P6, P4, P2 and P0 respectively. Thus, if input D0 is logic "high," input DN0 will be logic "low." Accordingly, a voltage will be transmitted to the gates of transistors 105–108, while no voltage flows to the gates of transistors 101–104.

Input lines D1 and DN1 are connected to the gate terminals of n-type transistors 111–112 and 109–110, respectively, and input lines D2 and DN2 are connected to the gate terminals of n-type transistors 113 and 114, respectively. Each input line that transmits logic "high," will turn on the transistors having a gate terminal connected to that line, while input lines transmitting a logic "low" will turn off the transistors having a gate terminal connected to the line.

The transistors connected in series in the decoder 100 can be thought of as performing a logic AND function, while transistors connected in parallel perform a logical OR function. Thus, transistor 113 performs a logical AND function with transistors 111 and 109, wherein transistors 111 and 109 are performing a logic OR respective to each other. In turn, transistor 111 performs a respective logical AND with transistors 105 and 101, which perform a logical OR respective to each other, and so on.

Still referring to FIG. 3, as a first example, if an input "001" (D2=0, D1=0, D0=1) is transmitted to decoder circuit 100, the complement "110" (DN2=1, DN1=1, DN0=0) will also be transmitted from mismatch counter 320. Since lines D0, DN1, and DN2 are logic high (i.e., "1"), transistors 105–108, 109–110, and 114 will be turned on. Since the three series-connected transistors 114, 110, and 108 are conducting, output line P1 will be coupled to ground and a current will flow along the line connecting P1 and transistors 114, 110 and 108.

As a second example, if an input "110" (D2=1, D1=1, D0=0) is transmitted to the decoder circuit 100, the complement "001" (DN2=0, DN1=0, DN0=1) will be transmitted along with the original input. Since lines DN0, D1 and D2 are logic high (i.e., "1"), transistors 101–104, 111–112 and 113 will be turned on. Since the only current path open is the path along transistors 113, 111 and 101 (the only active transistors in the pathway to ground), output line P6 will be coupled to ground and a current will flow along the line connecting P6 and transistors 113, 111, and 101. As will be described in greater detail below in connection with FIG. 4, each of the priority code positions P0–P7 are sensed to determine which one or ones are carrying current.

Each time the MATCH signal is activated, current will flow through one of the priority code output lines (P0–P7) of decoder 100. In this manner, a priority code value is established for the CAM word depending on the longest match detected. Generally, the longer the match, the greater the priority and vice versa.

Turning to FIG. 4, a priority selection circuit 701 is disclosed, wherein each corresponding priority output line (P0–P7) from each priority setting circuit 700 is coupled together to a respective resistor in resistor bank 383. Since the priority output lines are connected in parallel, current flowing through any of the priority output code lines (P0–P7) causes a voltage drop across a respective resistor 383. There can be a voltage drop across one resistor or any number of resistors simultaneously. Each resistor 383 is further connected to respective sense amplifiers 384A–H to sense the respective quantities of current flowing through the priority code lines P0–P7, with P0 being configured to have the highest priority, and inputs P1–Pn having a progressively lower priority. The outputs of the sense amplifiers 384A–H are in turn connected to a highest priority pointer circuit 450.

Highest priority pointer 450 points to the CAM word(s) from the group being tested having the highest lateral priority. The highest priority pointer 450 points back to the CAM word having the highest lateral priority. The logic configuration in the highest priority pointer 450 is set so that, no matter how many inputs are simultaneously active, the pointer will only output one line (R0–R7) as the active line (logic "1").

Looking together at FIGS. 3 and 4, the output of the highest priority pointer 450 (R0–R7) is fed back to each priority setting circuit 700 of each CAM word (400–403). Each output of the pointer 450 is inputted (R0–R7) into a respective AND gate 368–375 as shown in FIG. 3. The outputs of priority code circuit 201 in FIG. 3 are also connected to address decoder 378 that enables only one AND gate 368–375 to be active. Accordingly, the combination of the priority code (D0–D2), as decoded by the address decoder 378 and the fed-back output (R0–R7) of the highest priority pointer 450 selects one gate for output to gate 376 and output ($G_n$). Respective outputs $G_0$–$G_n$ from each CAM word are then inputted to a priority encoder 900 which establishes the address of the CAM word with the longest match.

Figure 5:
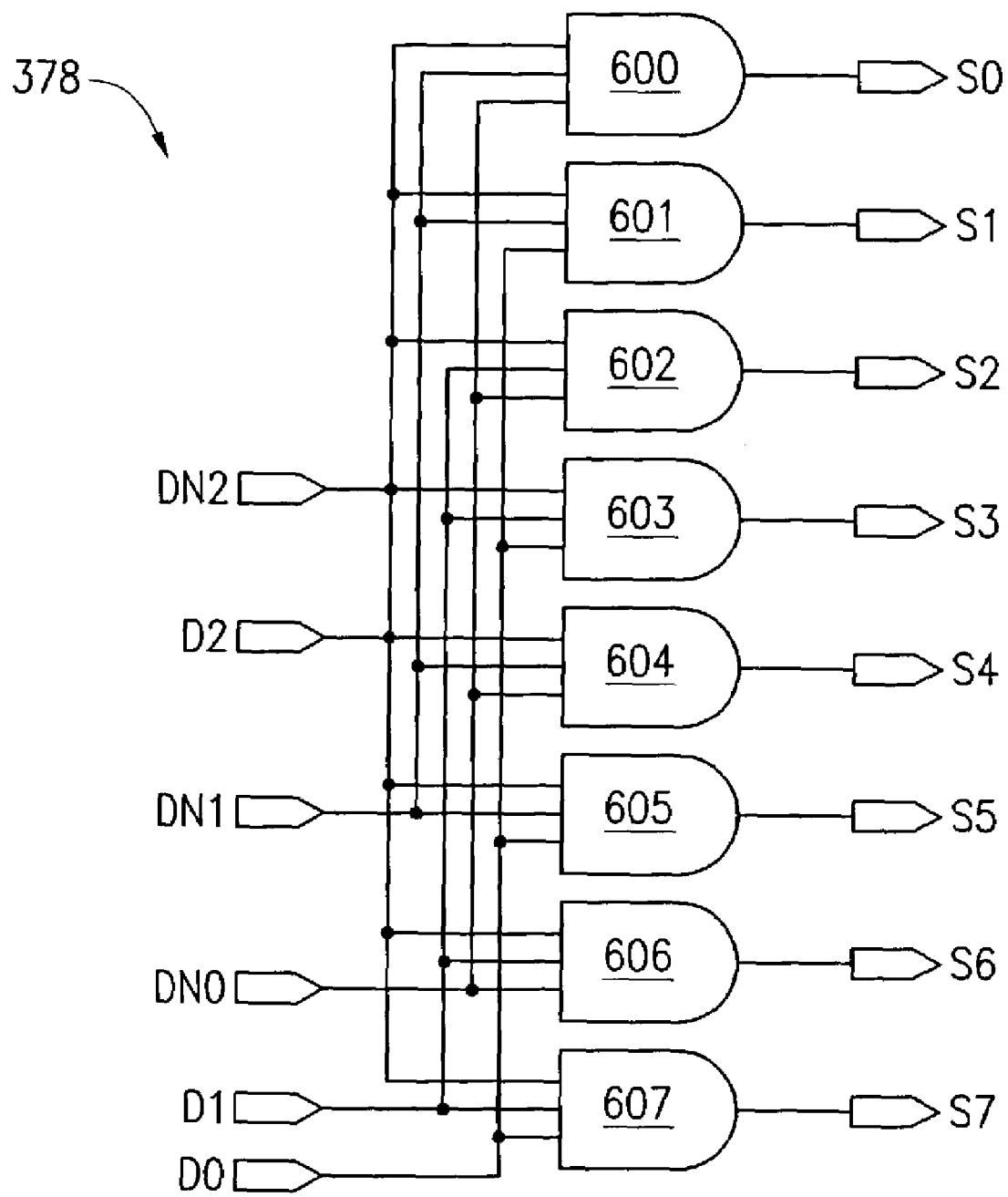
FIG. 5 illustrates an address decoder as used in the FIG. 3 priority setting circuit.

Turning now to FIG. 5, the address decoder 378 (of FIG. 3) is described in greater detail. Inputs D0–D2 and complement signals DN0–DN2 are input into logic AND gates 600–607, wherein AND gates 600–607 respectively output signals S0–S7 which are then transmitted to a respective input on NAND gates 368–375 shown in FIG. 3, whose outputs are collectively NORed at gate 376. NOR gate 376 generates a priority signal $G_n$. The outputs S0–S7 are determined by the following logical functions:

S0=DN0\*DN1\*DN2  S4=DN0\*DN1\*D2
S1=D0\*DN1\*DN2   S5=D0\*DN1\*D2
S2=DN0\*D1\*DN2   S6=DN0\*D1\*D2
S3=D0\*D1\*DN2    S7=D0\*D1\*D2

Figure 6:
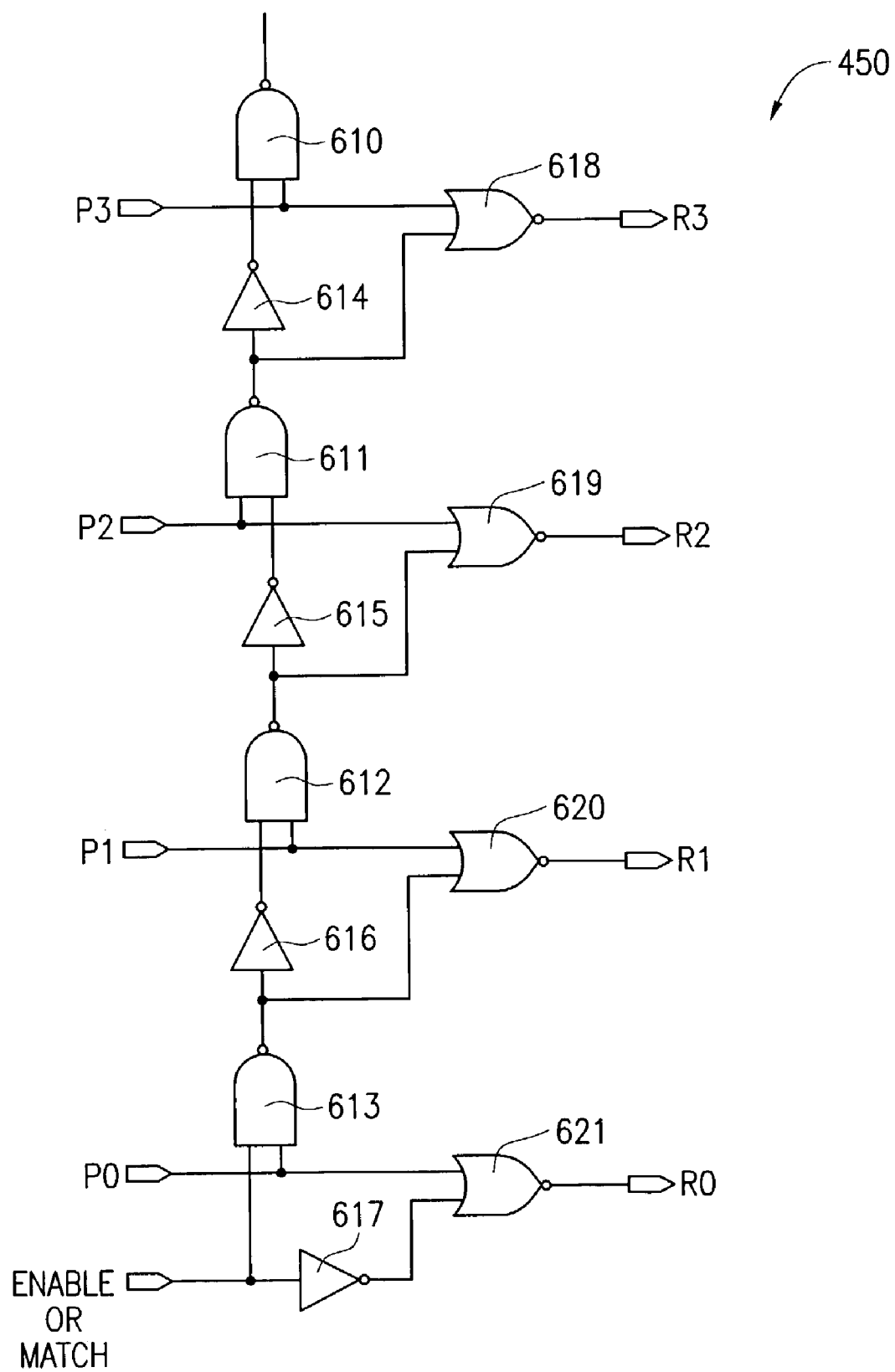
FIG. 6 illustrates a highest priority pointer as used in the FIG. 4 priority selection circuit.

Turning to FIG. 6, a portion of the highest priority pointer 450 (of FIG. 4) is described in greater detail. Each input line shown (only P0–P3 are shown for simplicity) is connected to an input terminal of NOR gates 618–621 and NAND gates 610–613. The output of each NAND gate 611–613 is shown as being inputted into a second terminal of NOR gates 618–620, respectively. The output of each NAND gate 611–613 is further inverted by inverters 614–616 and transmitted to adjacent NAND gates 610–613.

Figure 7:
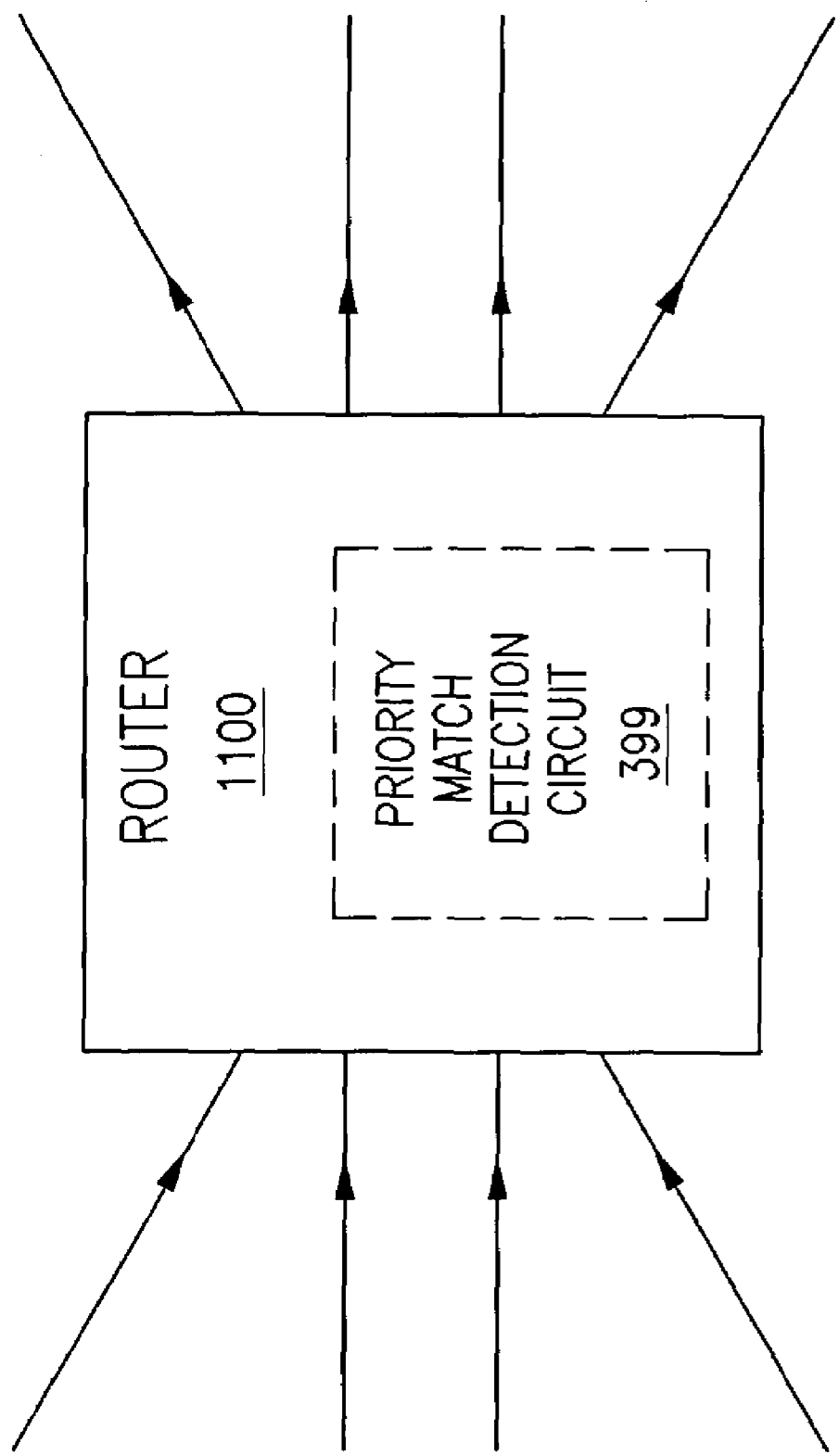
FIG. 7 depicts a simplified block diagram of a router employing the FIG. 1 priority match detection circuit in accordance with another exemplary embodiment of the invention.

FIG. 7 is a simplified block diagram of a router 1100 as may be used in a communications network, such as, e.g., part of the Internet backbone. The router 1100 contains a plurality of input lines and a plurality of output lines. When data is transmitted from one location to another, it is sent in a form known as a packet. Oftentimes, prior to the packet reaching its final destination, that packet is first received by a router, or some other device. The router 1100 then decodes that part of the data identifying the ultimate destination and decides which output line and what forwarding instructions are required for the packet.

Generally, CAMs are very useful in router applications because historical routing information for packets received from a particular source and going to a particular destination is stored in the CAM of the router. As a result, when a packet is received by the router 1100, the router already has the forwarding information stored within its CAM. Therefore, only that portion of the packet that identifies the sender and recipient need be decoded in order to perform a search of the CAM to identify which output line and instructions are required to pass the packet onto a next node of its journey.

Still referring to FIG. 7, router 1100 contains the added benefit of employing a semiconductor memory chip containing a priority match detection circuit, such as that described in connection with FIGS. 1–6. Therefore, the CAM has the benefit of providing "longest match" detection and expanded pattern recognition, in accordance with an exemplary embodiment of the invention.

Figure 8:
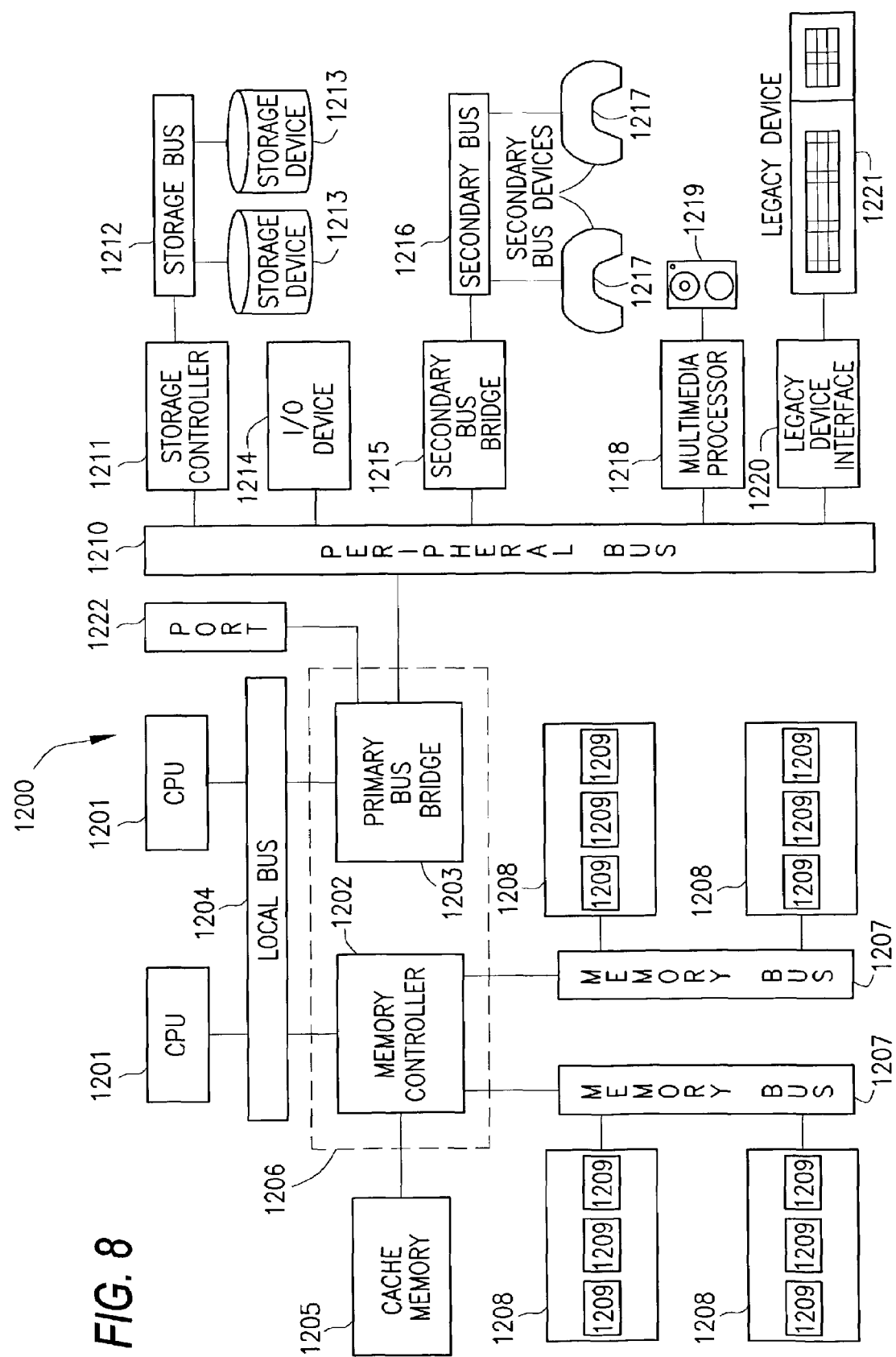
FIG. 8 depicts a block diagram of a processor system employing the FIG. 1 priority match detection circuit, in accordance with yet another exemplary embodiment of the invention.

FIG. 8 illustrates an exemplary processing system 1200 which utilizes a CAM priority match detection circuit such as that described in connection with FIGS. 1–6. The processing system 1200 includes one or more processors 1201 coupled to a local bus 1204. A memory controller 1202 and a primary bus bridge 1203 are also coupled the local bus 1204. The processing system 1200 may include multiple memory controllers 1202 and/or multiple primary bus bridges 1203. The memory controller 1202 and the primary bus bridge 1203 may be integrated as a single device 1206.

The memory controller 1202 is also coupled to one or more memory buses 1207. Each memory bus accepts memory components 1208. Any one of memory components 1208 may contain a CAM array performing priority match detection as described in connection with FIGS. 1–6.

The memory components 1208 may be a memory card or a memory module. The memory components 1208 may include one or more additional devices 1209. For example, in a SIMM or DIMM, the additional device 1209 might be a configuration memory, such as a serial presence detect (SPD) memory. The memory controller 1202 may also be coupled to a cache memory 1205. The cache memory 1205 may be the only cache memory in the processing system. Alternatively, other devices, for example, processors 1201 may also include cache memories, which may form a cache hierarchy with cache memory 1205. If the processing system 1200 include peripherals or controllers which are bus masters or which support direct memory access (DMA), the memory controller 1202 may implement a cache coherency protocol. If the memory controller 1202 is coupled to a plurality of memory buses 1207, each memory bus 1207 may be operated in parallel, or different address ranges may be mapped to different memory buses 1207.

The primary bus bridge 1203 is coupled to at least one peripheral bus 1210. Various devices, such as peripherals or additional bus bridges may be coupled to the peripheral bus 1210. These devices may include a storage controller 1211, a miscellaneous I/O device 1214, a secondary bus bridge 1215, a multimedia processor 1218, and a legacy device interface 1220. The primary bus bridge 1203 may also be coupled to one or more special purpose high speed ports 1222. In a personal computer, for example, the special purpose port might be the Accelerated Graphics Port (AGP), used to couple a high performance video card to the processing system 1200.

The storage controller 1211 couples one or more storage devices 1213, via a storage bus 1212, to the peripheral bus 1210. For example, the storage controller 1211 may be a SCSI controller and storage devices 1213 may be SCSI discs. The I/O device 1214 may be any sort of peripheral. For example, the I/O device 1214 may be an local area network interface, such as an Ethernet card. The secondary bus bridge may be used to interface additional devices via another bus to the processing system. For example, the secondary bus bridge may be an universal serial port (USB) controller used to couple USB devices 1217 via to the processing system 1200. The multimedia processor 1218 may be a sound card, a video capture card, or any other type of media interface, which may also be coupled to one additional device such as speakers 1219. The legacy device interface 1220 is used to couple legacy devices, for example, older styled keyboards and mice, to the processing system 1200.

The processing system 1200 illustrated in FIG. 8 is only an exemplary processing system with which the invention may be used. While FIG. 8 illustrates a processing architecture especially suitable for a general purpose computer, such as a personal computer or a workstation, it should be recognized that well known modifications can be made to configure the processing system 1200 to become more suitable for use in a variety of applications. For example, many electronic devices which require processing may be implemented using a simpler architecture which relies on a CPU 1201 coupled to memory components 1208 and/or memory devices 1209. The modifications may include, for example, elimination of unnecessary components, addition of specialized devices or circuits, and/or integration of a plurality of devices.

While the invention has been described in detail in connection with preferred embodiments known at the time, it should be readily understood that the invention is not limited to the disclosed embodiments. Rather, the invention can be modified to incorporate any number of variations, alterations, substitutions or equivalent arrangements not heretofore described, but which are commensurate with the spirit and scope of the invention. For example, although the invention has been described in connection with specific circuits employing different configurations of p-type and n-type transistors, the invention may be practiced with many other configurations without departing from the spirit and scope of the invention. In addition, although the invention is described in connection with flip-flop memory cells, it should be readily apparent that the invention may be practiced with any type of memory cell. It is also understood that the logic structures described in the embodiments above can substituted with equivalent logic structures to perform the disclosed methods and processes. Accordingly, the invention is not limited by the foregoing description or drawings, but is only limited by the scope of the appended claims.

The invention claimed is:

1. A circuit for setting the priority among a plurality of CAM words, comprising:
   a storage register, having a plurality of storage devices, each storage device storing a bit from a predetermined priority code for a corresponding one of said plurality of CAM words, said storage register having n outputs and m complement outputs for each CAM word;
   a priority setting circuit, connected to each of the n and m outputs of said storage register, said priority setting circuit providing $2^n$ outputs, wherein said priority setting circuit activates one of said $2^n$ outputs when receiving said outputs from said storage register, where n and m are positive whole numbers.

2. The priority setting circuit of claim 1, wherein the storage devices are flip-flops.

3. The priority setting circuit of claim 2, further comprising:
   a plurality of resistors, each of said plurality of resistors being connected to a respective output of each said priority setting circuit, said resistors being further coupled to a supply voltage.

4. The priority setting circuit of claim 3, further comprising:
   a plurality of sensing circuits for sensing a current flow across said resistors, wherein each of said plurality of sensing circuits are connected to a respective output of each said priority setting circuit.

5. The priority setting circuit of claim 4, further comprising:
   a highest priority pointer, receiving the sensed current from each of said sensing circuits, said highest priority pointer feeding back $2^n$ outputs to each of the plurality of priority setting circuits.

6. The priority setting circuit of claim 5, wherein each of the priority setting circuits further comprises an address decoder coupled to the n outputs of said storage devices, said address decoder having $2^n$ outputs.

7. The priority setting circuit of claim 6, wherein the $2^n$ outputs from the address decoder are input to a plurality of logic gates.

8. The priority setting circuit of claim 7, wherein the plurality of logic gates each have a second terminal connected to a corresponding one of the $2^n$ output of said highest priority pointer.

9. The priority setting circuit of claim 8, wherein the plurality of logic gates each have a third terminal connected to an MATCH line input.

10. The priority setting circuit of claim 9, wherein the outputs of the plurality of logic gates are all connected to the input of a priority logic gate, which outputs a main priority signal for a respective CAM word.

11. The priority setting circuit of claim 10, further comprising a priority encoder, said encoder receiving the main priority signals from each of CAM words.

12. A circuit for determining a longest match in a plurality of CAM words, comprising:
    a plurality of match detection circuits, each of which are associated with a respective CAM word, and each of said match detection circuits providing a match output signal when a match is detected between a predetermined number of bits of an associated CAM word and comparand data;
    a plurality of decoding circuits, each coupled to a respective match output signal, each decoding circuit including a priority code circuit coupled to an associated current based decoder and an address decoder, wherein each decoding circuit outputs a priority match signal when a respective match output signal is active, wherein the value of the priority match signal is dependent on the output of said current decoder and said address decoder; and
    a priority selection circuit connected to the outputs of said plurality of decoding circuits, wherein each of the CAM words are prioritized according to their priority match signal.

13. The circuit according to claim 12, wherein the current based decoder has n input lines and m complement input lines, and $2^n$ output lines, where n and m are positive whole numbers.

14. The circuit according to claim 13, wherein a resistive element is connected to each of said $2^n$ outputs.

15. The circuit according to claim 14, wherein each of a plurality of sensing circuits is connected to each of said $2^n$ outputs, said sensing circuits outputting a sensed signal to a highest priority pointer circuit.

16. The circuit according to claim 16, wherein the highest priority pointer circuit feeds a highest priority code through $2^n$ outputs back to each decoding circuit.

17. The circuit according to claim 16, wherein each address decoder has $2^n$ outputs, wherein each of the $2^n$ outputs are connected to a logic gate.

18. The circuit according to claim 17, wherein each of the logic gates receive one output from said highest priority pointer circuit.

19. The circuit according to claim 18, wherein each of the logic gates has one terminal connected to the march output signal.

20. The circuit according to claim 19, wherein the logic gates are NAND gates.

21. The circuit according to claim 19, wherein the outputs of each of the logic gates are coupled to a single priority logic gate.

22. The circuit according to claim 21, wherein the priority logic gate outputs an output match signal to the priority selection circuit.

23. A processing system, comprising:
    a processing unit;
    a memory component coupled to said processing unit, said memory component containing a longest match detection circuit for a plurality of content addressable memories (CAMs), said longest match detection circuit comprising:

a plurality of match detection circuits, each of which are associated with a respective CAM word, and each of said match detection circuits providing a match output signal;

a plurality of decoding circuits, each coupled to a respective match output signal, each decoding circuit including a priority code circuit coupled to an associated current based decoder and an address decoder, wherein each decoding circuit outputs a priority match signal when a respective match output signal is active, wherein the value of the priority match signal is dependent on the output of said current decoder and said address decoder, and a priority resolver circuit connected to the outputs of said plurality of decoding circuits, wherein each of the CAM words are prioritized according to their priority match signal.

24. The circuit according to claim 23, wherein the current based decoder has n input lines and m complement input lines, and $2^n$ output lines, where n and m are positive whole numbers.

25. The circuit according to claim 24, wherein a resistive element is connected to each of said $2^n$ outputs.

26. The circuit according to claim 25, wherein each of a plurality of sensing circuits is connected to each of said $2^n$ outputs, said sensing circuits outputting a sensed signal to a highest priority pointer circuit.

27. The circuit according to claim 26, wherein the highest priority pointer circuits feeds a highest priority code through $2^n$ outputs back in each decoding circuit.

28. The circuit according to claim 27, wherein each address decoder has $2^n$ outputs, wherein each of the $2^n$ outputs are connected to a logic gate.

29. The circuit according to claim 28, wherein each of the logic gates receive one output from said highest priority pointer circuit.

30. The circuit according to claim 29, wherein each of the logic gates have one terminal connected to the match output signal.

31. The circuit according to claim 30, wherein the logic gates are NAND gates.

32. The circuit according to claim 30, wherein the outputs of each of the logic gates are coupled to a single priority logic gate.

33. The circuit according to claim 32, wherein the priority logic gate outputs an output match signal to the priority resolving circuit.

34. A router, comprising:
a plurality of message receiving inputs;
a plurality of message transmitting outputs; and
a semiconductor processing device, comprising:

a plurality of match detection circuits for a content addressable memory (CAM), said CAM being used to route messages on said inputs to said outputs, and each of said match detection circuits providing a match output signal;

a plurality of decoding circuits, each coupled to a respective match output signal, each decoding circuit including a priority code circuit coupled to an associated current based decoder and an address decoder, wherein each decoding circuit outputs a priority match signal when a respective match output signal is active, wherein the value of the priority match signal is dependent on the output of said current decoder and said address decoder; and a priority resolver circuit connected to the outputs of said plurality of decoding circuits, wherein each of the CAM words are prioritized according to their priority match signal.

35. The circuit according to claim 34, wherein the current based decoder has n input lines and m complement input lines, and $2^n$ output lines, where n and m are positive whole numbers.

36. The router according to claim 35, wherein a resistive element is connected to each of said $2^n$ outputs.

37. The router according to claim 36, wherein each of a plurality of sensing circuits is connected to each of said $2^n$ outputs, said sensing circuits outputting a sensed signal to a highest priority pointer circuit.

38. The router according to claim 37, wherein the highest priority pointer circuit feeds a highest priority code through $2^n$ outputs back to each decoding circuit.

39. The router according to claim 38, wherein each address decoder has $2^n$ outputs, wherein each of the $2^n$ outputs are connected to a logic gate.

40. The router according to claim 39, wherein each of the logic gates receive one output from said highest priority pointer circuit.

41. The router according to claim 40, wherein each of the logic gates have one terminal connected to the match output signal.

42. The router according to claim 41, wherein the logic gates are NAND gates.

43. The router according to claim 41, wherein the outputs of each of the logic gates are coupled to a single priority logic gate.

44. The router according to claim 43, wherein the priority logic gate outputs an output match signal to the priority resolver circuit.

* * * * *

UNITED STATES PATENT AND TRADEMARK OFFICE
CERTIFICATE OF CORRECTION

PATENT NO. : 7,016,210 B2
APPLICATION NO. : 10/330209
DATED : March 21, 2006
INVENTOR(S) : Alon Regev et al.

Page 1 of 1

It is certified that error appears in the above-identified patent and that said Letters Patent is hereby corrected as shown below:

In the Specification, the following errors are corrected:

Column 1, line 8, "device" should read --devices--;

Column 7, line 65, "coupled the" should read --coupled to the --;

Column 8, line 19, "include" should read --includes--;

Column 8, line 43, "an local" should read --a local--;

Column 8, line 47, "an universal" should read --a universal--; and

Column 8, line 48, "via to the" should read --via the--.

In the Claims, the following errors are corrected:

Claim 9, column 10, line 7, "an MATCH" should read --a MATCH--; and

Claim 11, column 10, line 14, "each of CAM" should read --each of the CAM; and

Claim 16, column 10, line 45, "claim 16" should read --claim 15--.

Signed and Sealed this

Eleventh Day of July, 2006

JON W. DUDAS
*Director of the United States Patent and Trademark Office*